United States Patent
Tamjidi

(12) 
(10) Patent No.: US 6,262,606 B1
(45) Date of Patent: Jul. 17, 2001

(54) WAVEFORM COMPENSATED OUTPUT DRIVER

(75) Inventor: Mohammad R. Tamjidi, Milpitas, CA (US)

(73) Assignee: Dolphin Technology, Inc., Milpitas, CA (US)

( * ) Notice: Subject to any disclaimer, the term of this patent is extended or adjusted under 35 U.S.C. 154(b) by 0 days.

(21) Appl. No.: 09/631,748

(22) Filed: Aug. 4, 2000

(51) Int. Cl.[7] ................................................ H03K 3/00
(52) U.S. Cl. ........................ 327/108; 327/403; 327/362
(58) Field of Search ................................. 327/403, 407, 327/108, 544–546, 362; 714/724, 704; 324/537; 365/189.05; 358/502

(56) References Cited

U.S. PATENT DOCUMENTS

| | | | |
|---|---|---|---|
| 4,945,267 | * | 7/1990 | Galbraith .............................. 327/434 |
| 5,003,560 | * | 3/1991 | Kim ...................................... 327/231 |
| 5,373,508 | * | 12/1994 | Guliani ................................. 371/20.1 |
| 5,504,761 | * | 4/1996 | Shinbashi et al. ................... 371/57.2 |
| 5,642,063 | * | 6/1997 | Lehikolnen ............................ 327/74 |
| 5,883,534 | * | 3/1999 | Kondoh et al. ....................... 327/156 |
| 6,181,730 | * | 1/2001 | Negi ..................................... 375/142 |

* cited by examiner

*Primary Examiner*—Toan Tran
(74) *Attorney, Agent, or Firm*—Dinh & Associates

(57) ABSTRACT

An output driver that includes a waveform detector and a driver unit. The waveform detector receives at least one data signal, detects for particular patterns of interest (e.g., a sequence of zeros or ones) within the received data signal, and provides one or more control signals indicative of the detected patterns of interest. The driver unit receives the data signal and provides at least one output signal in response thereto. The driver unit further receives the control signal(s) and adjusts one or more characteristics of the output signal based on the received control signal(s). Various characteristics of the output signal (e.g., slew rate, delay, drive strength, and others) can be adjusted to achieved the desired result (e.g., reduced amount of skew, ISI). The driver unit can be designed to include a pre-driver that receives the data signal and provides at least one pre-drive signal and a driver that receives the pre-drive signal and provides the output signal. The pre-driver and drive can each further receive the control signal(s) and adjust one or more characteristics of its output signal based on the received control signal(s).

22 Claims, 8 Drawing Sheets

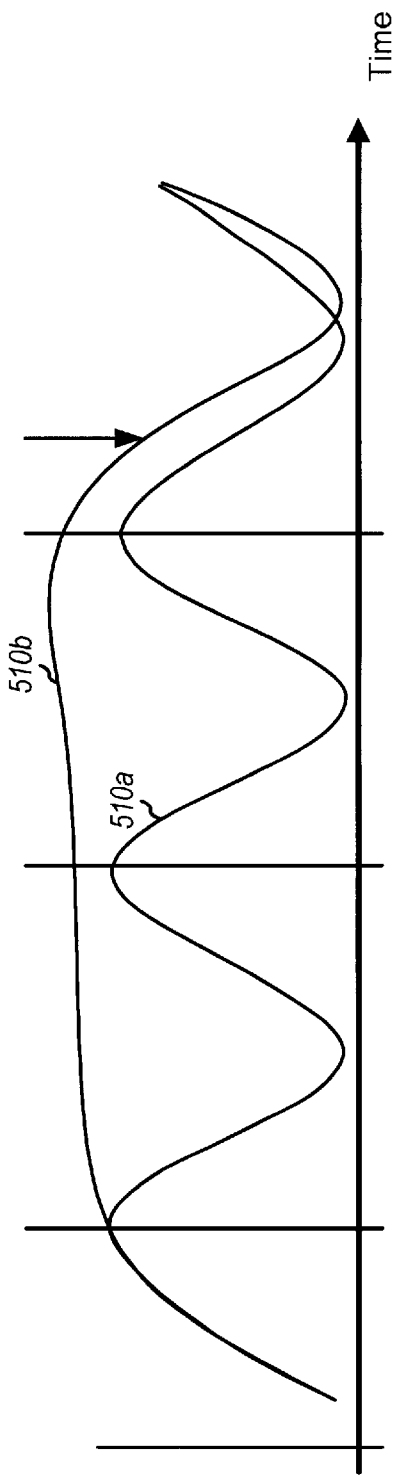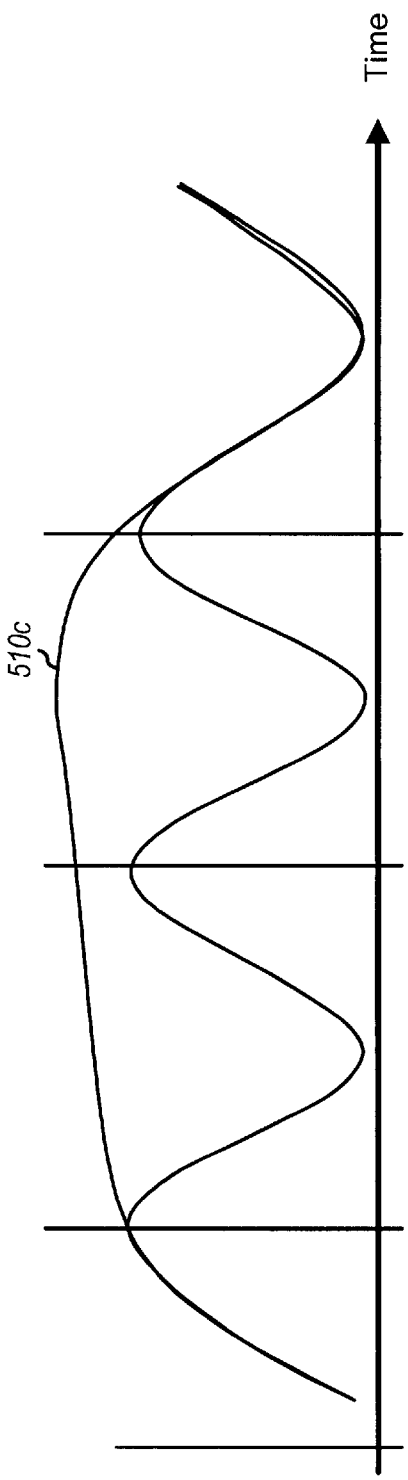

WAVEFORM COMPENSATED OUTPUT DRIVER

BACKGROUND OF THE INVENTION

The present invention relates generally to circuits. More particularly, it relates to an output driver having characteristics that can be adjusted based on the waveform being provided to the driver.

An output driver is commonly used to provide drive capability for an output of an integrated circuit. The required drive capability is typically dependent on the load capacitance and impedance associated with the output line being driven and applicable design specifications. The output driver can be designed and operated with higher output current to drive more load capacitance.

Output drivers are used for various integrated circuits such as application specific integrated circuits (ASICs), digital signal processors, microprocessors, controllers, memory devices, and so on. These integrated circuits are used for a wide variety of applications including computing, networking, communication, data transmission, and others.

For many applications, the data provided to the output driver is random and can be any sequence of zeros and ones. During periods in which the data changes often between zero and one, the time between transitions is shorter and the output driver appears to be switched at a high rate. Conversely, during periods in which there is a long sequence of zeros or ones, the time between transitions is longer and the output driver appears to be switched at a lower rate.

For an output driver having a fixed output drive capability, the characteristics of the output waveform can vary depending on the particular data sequence being provided to the driver. During periods of frequent data transitions, a shorter time duration is available for each transition and the output signal may not be able to completely transition from a starting level to a final level. The peak-to-peak signal swing may thus be smaller during such periods of frequent data transition. Conversely, during periods of less frequent data transitions, a longer time duration is available for each transition and the output signal may be able to completely transition from the starting level to the final level. The peak-to-peak signal swing may thus be greater because more time is available to complete the transition. However, for the next data transition, the signal is starting from a higher (or lower) level and would therefore require a longer time period to transition to a mid-point (see FIGS. 5A and 5B, which are described below). Thus, a skew exists between a frequently switched signal and a less frequently switched signal. This skew translates to inter-symbol interference (ISI), which in turn can cause detection error at a receiving device.

For some applications, it is desirable to provide an output signal having a reduced amount of skew regardless of the data sequence being driven. This may improve the detection of the data at the receiving device. Thus, an output driver having characteristics that can be adjusted based on the received data sequence to provide an output signal having reduced amount of skew is highly desirable.

SUMMARY OF THE INVENTION

The invention provides an output driver capable of providing reduced amount of skew in the output signal for improved performance. As recognized by the present invention, the amount of skew may be dependent on the data pattern being provided to the output driver. Thus, the invention detects for patterns of interest in the input data signal and appropriately adjusts certain characteristics of the output signal to reduce the amount of skew.

An embodiment of the invention provides an output driver that includes a waveform detector and a driver unit. The waveform detector receives at least one data signal, detects for particular patterns of interest within the received data signal, and provides one or more control signals indicative of detection of patterns of interest in the received data signal. The driver unit receives the data signal and provides at least one output signal in response thereto. The driver unit further receives the control signal(s) and adjusts one or more characteristics of the output signal in accordance with the received control signal(s).

Various characteristics of the output signal can be adjusted to achieve the desired result (e.g., reduced amount of skew and ISI). For example, the slew rate, delay, drive strength, and other characteristics of the output signal can be adjusted based on the detected patterns of interest.

The driver unit can be designed to include a pre-driver coupled to a driver. The pre-driver receives the data signal and provides at least one pre-drive signal in response thereto. The pre-driver can further receive the control signal(s) and adjust one or more characteristics of the pre-drive signal in accordance with the received control signal(s). The driver receives the pre-drive signal and provides the output signal in response thereto. The driver can also be designed to receive the control signal(s) and directly adjust one or more characteristics of the output signal in response.

The pre-driver typically includes at least one pre-driver circuit, one circuit for each output signal. Each pre-driver circuit can include a number of output circuits and can provide different drive strengths. One or more output circuits within each pre-driver circuit can be selectively disabled and enabled, based on a received control signal, to adjust the characteristics of the pre-drive signal being provided by the pre-driver circuit.

Each pre-driver circuit can further include a transmission gate and a switch. The transmission gate receives a control signal and a data signal and either passes or blocks the received data signal based on the received control signal. The switch also receives the control signal and selectively pulls an input of the pre-driver circuit to either logic high or logic low, again based on the received control signal.

The waveform detector can be designed to detect any patterns of interest. Typically, sequences of a particular number of (e.g., 2, 3, or more) consecutive zeros or ones are detected and used to generate the control signal(s). The waveform detector can include at least one set of delay elements, a pattern detector, and a control signal generator. One set of delay elements can be used to provide delay for each data signal. The pattern detector receives the delayed data signals and generates a set of intermediate signals indicative of the detected patterns of interest. The control signal generator receives the set of intermediate signals and generates the control signal(s).

Another embodiment of the invention provides a method for adjusting one or more characteristics of an output signal. In accordance with the method, at least one data signal is received and at least one output signal is provided in response thereto. Patterns of interest within the received data signal are detected and one or more control signals indicative of the detected patterns of interest are generated. One or more characteristics of the output signal are adjusted in accordance with the received control signal(s). Similar to that described above, various characteristics of the output signal (e.g., slew rate, delay, drive strength, and so on) can be adjusted based on the detected patterns to achieved the desired results (e.g., reduced amount of skew and ISI).

Various other aspects and features of the invention are also provided, as described in further detail below.

The foregoing, together with other aspects of this invention, will become more apparent when referring to the following specification, claims, and accompanying drawings.

BRIEF DESCRIPTION OF THE DRAWINGS

FIG. 5A is a diagram that shows exemplary waveforms for an output signal having frequent transitions versus an output signal having less frequent data transitions;

FIG. 5B is a diagram that shows an exemplary waveform for an output signal having less frequent data transitions but compensated in accordance with the invention to reduce the amount of skew;

DESCRIPTION OF THE SPECIFIC EMBODIMENTS

Figure 1:
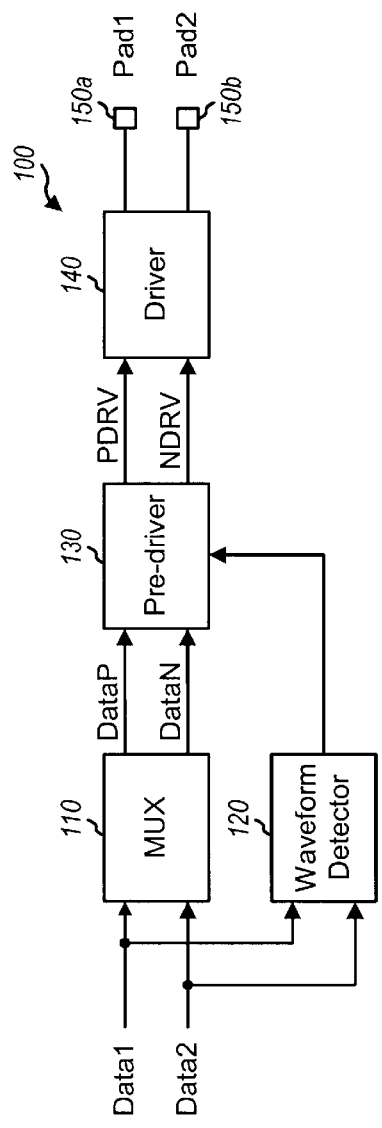
FIG. 1 is a simplified block diagram of an output driver in accordance with a specific embodiment of the invention.

FIG. 1 is a simplified block diagram of an output driver 100 in accordance with a specific embodiment of the invention. Output driver 100 is a specific design that receives two data signals (Data1 and Data2) and drives two output pads (Pad1 and Pad2).

Each data signal can be used to send any sequence of zeros and ones. The data signals Data1 and Data2 are provided to a multiplexer (MUX) 110 and a waveform detector 120. In this specific design, MUX 110 multiplexes the data received on the two data signals onto a differential data signal (DataP and DataN), which is then provided to a pre-driver 130. Waveform detector 120 detects the data patterns on the data signals, Data1 and Data2, and generates a set of control signals that are also provided to pre-driver 130. Pre-driver 130 provides a set of pre-drive signals having some characteristics that may be adjusted in accordance with the control signals received from waveform detector 120. The pre-drive signals are then provided to, and used by, a driver 140 to drive output pads 150a and 150b.

FIG. 1 shows a specific design of output driver 100, which supports data transmission on both the rising and falling edges of a clock signal, thus effectively doubling the data rate of the output signal. This higher effective data transmission is achieved with multiplexer 110 in FIG. 1. However, the invention can also be used for an output driver that supports data transmission on a single (rising or falling) edge of the clock signal. In such designs, a data signal (e.g., Data1 or Data2) can be provided to both pre-driver 130 and waveform detector 120.

In the design shown in FIG. 1, pre-driver 130 and driver 140 are shown as two elements. However, pre-driver 130 and driver 140 can be combined into a single element, the combination of which is collectively referred to as a "driver unit".

Typically, the data signal provided to pre-driver 130 is also provided to waveform detector 120, which then detects for particular patterns of interest in the received data signal. The data signal provided to pre-driver 130 is also appropriately delayed such that the control signals from waveform detector 120 can operate on the proper portion of the data signal to achieve the desired drive characteristics. In the specific design shown in FIG. 1, the patterns of interest can also be detected from the data signals Data1 and Data2 since multiplexer 110 simply alternates the data from data signals Data1 and Data2 onto the multiplexed data signal DataP.

Figure 2:
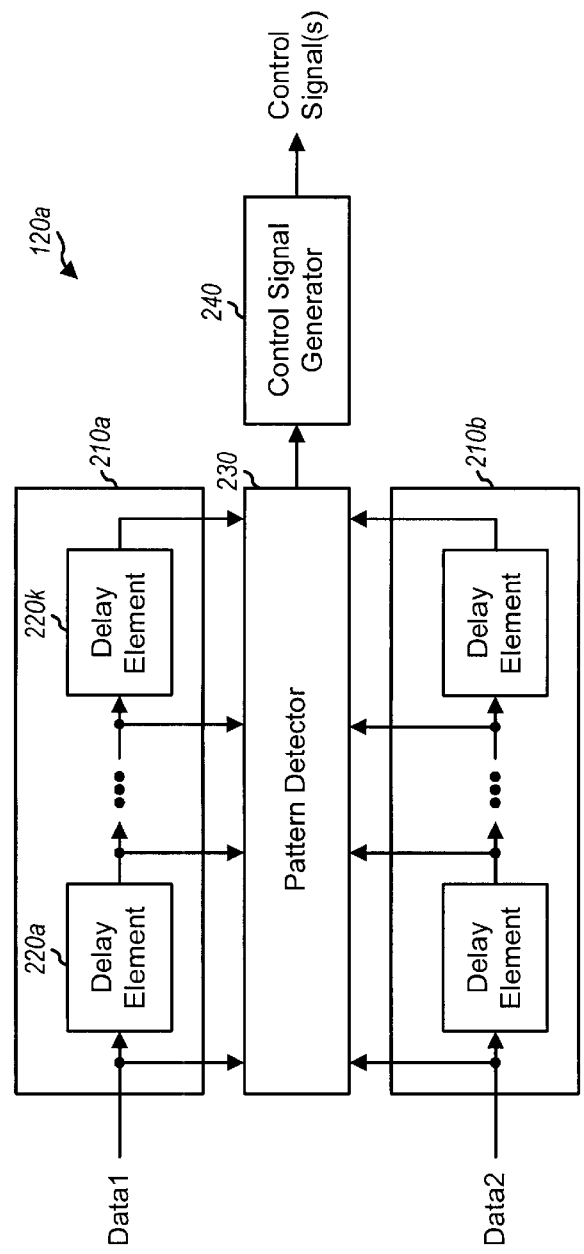
FIGS. 2 and 3 are a block diagram and a schematic diagram of an embodiment of a waveform detector.

FIG. 2 is a block diagram of an embodiment of a waveform detector 120a, which can be used to implement waveform detector 120 in FIG. 1. In this embodiment, the two data signals Data1 and Data2 are provided to two sets of delay elements 210a and 210b, respectively. Each set of delay elements 210 includes one or more delay elements 220, with the number of delay elements being dependent on the particular data patterns to be detected, as described below. Generally, more delay elements 220 are used to detect longer patterns. Each delay element 220 provides a particular amount of delay (e.g., one clock period) for the received data signal.

The data signals and the delayed data signals from delay elements 220 in each set 210 are provided to a pattern detector 230, which detects for patterns of interest in the received data signals, Data1 and Data2. Pattern detector 230 then provides to a control signal generator 240 one or more signals indicative of the detected patterns. Control signal generator 240 then generates a set of one or more control signals for pre-driver 130 based on the detected patterns (as identified by the signals received from pattern detector 230). The control signals may further be generated based on the desired adjustments to be achieved in drive characteristics, the particular design of the driver unit, and other factors.

Figure 3:
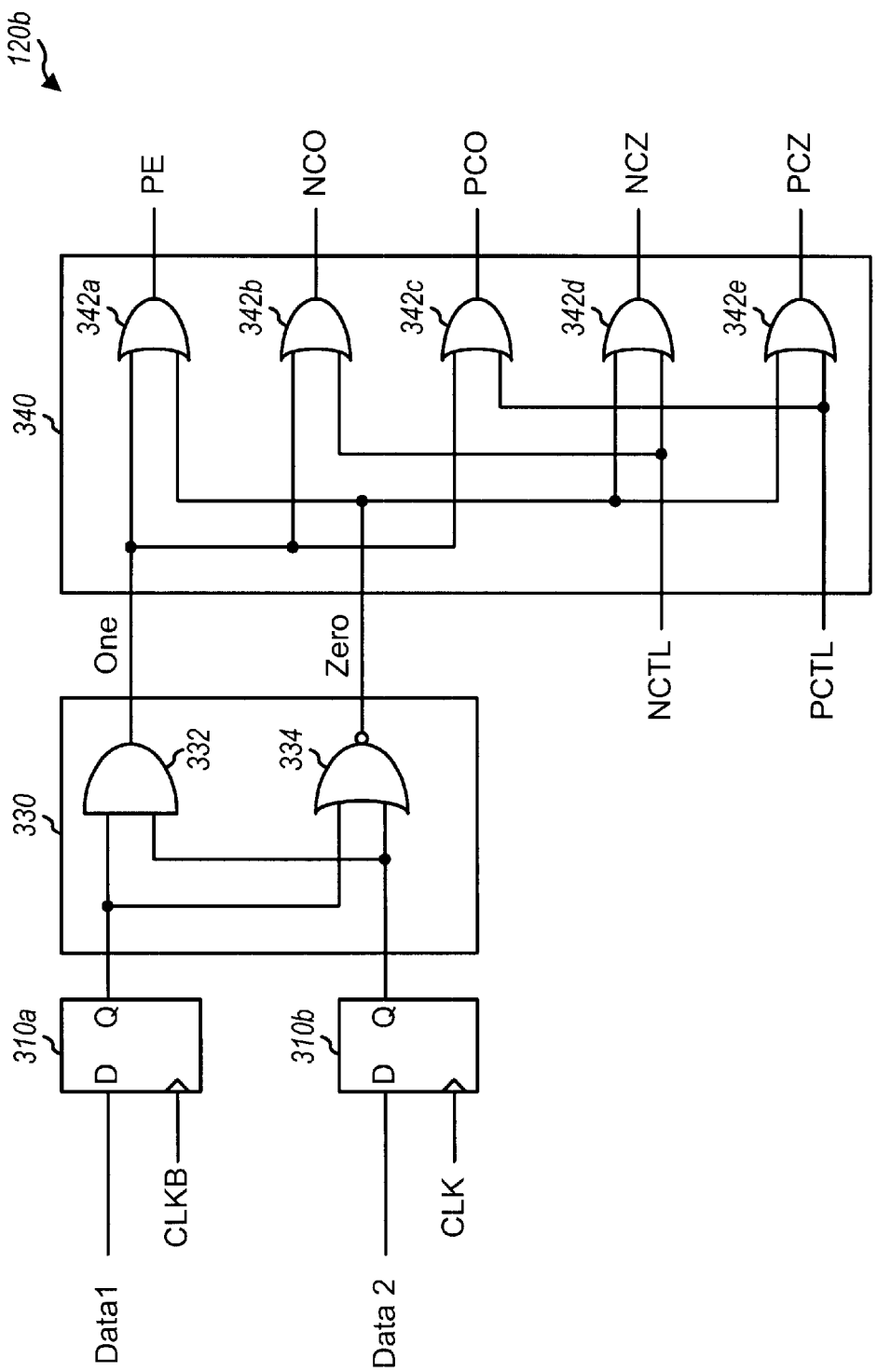

FIG. 3 is a schematic diagram of a specific design of a waveform detector 120b, which can also be used to implement waveform detector 120 in FIG. 1. In this simple design, waveform detector 120b detects a sequence of two consecutive zeros or ones. Waveform detector 120b then generates a set of control signals based on the detected ("00") and ("11") patterns.

As shown in FIG. 3, the two data signals Data1 and Data2 are provided to two registers 310a and 310b, respectively. Register 310a is clocked with the complementary clock signal, CLKB, and register 310b is clocked with the clock signal, CLK. The differential clock signal is used when data is transmitted on both edges of the clock signal. Otherwise, a single-ended clock signal can be used. The outputs from registers 310a and 310b are provided to a pattern detector 330 comprised of an AND gate 332 and a NOR gate 334. AND gate 332 detects the occurrence of two consecutive ones and provides an output signal, One, indicative of this condition. Similarly, NOR gate 334 detects the occurrence of two consecutive zeros and provides an output signal, Zero, indicative of this condition.

As described in further detail below, the data on the data signals, Data1 and Data2, are multiplexed onto a differential data signal, DataP and DataN, to implement DDR. This can be achieved by alternatively multiplexing the data bits on the data signals, Data1 and Data2, onto the data signal, DataP. For example, the data bits on the data signal Data1 can be provided on one portion (e.g., the high half) of the clock signal CLK and the data bits on the data signal Data2 can be provided on the alternative portion (e.g., the low half) of the clock signal. Thus, to detect the transmission of two consecutive ones on the data signal DataP, two data bits on the data signals, Data1 and Data2, at any particular clock cycle can be collected and analyzed. Specifically, two consecutive ones are transmitted on the data signal DataP if both data bits on the data signals Data1 and Data2 are high, and two consecutive zeros are transmitted if both data bits are low. The detection of two high data bits is achieved with AND gate 332, which provides a high output if two consecutive ones detected. Correspondingly, the detection of two low data bits is achieved with NOR gate 334, which provides a high output if two consecutive zeros are detected.

In the specific design shown in FIG. 3, the signals One and Zero and two input control signals, NCTL and PCTL, are provided to a control signal generator 340, which then generates the output control signals for the pre-driver. In this specific design, the input control signals NCTL and PCTL are used to "overdrive" the subsequent drive adjustment circuitry within the pre-driver such that faster transitions and stronger drive can be enabled at all times. This overdrive feature is especially advantageous to compensate for worse case conditions (e.g., a slow fabrication process, low supply voltage, and so on). In other designs, input control signals can also be provided to disable the drive adjustment circuitry and this is within the scope of the invention.

In the specific design shown in FIG. 3, control signal generator 340 includes OR gates 342a, 342b, 342c, 342d, and 342e that provide the output control signals PE, NCO, PCO, NCZ, and PCZ, respectively, which are used to adjust the characteristics of the output signals provided by the output driver. For this design, the signal PE is logic high if two consecutive ones or zeros are detected. The signals NCO and NCZ are both logic high if the input control signal NCTL is high, and the signals PCO and PCZ are both logic high if the input control signal PCTL is high. The signal NCO (or NCZ) is also logic high if two consecutive ones (or zeros) are detected, respectively, and the signal PCO (or PCZ) is also logic high if two consecutive ones (or zeros) are detected, respectively. The application of these output control signals in the pre-driver is described in further detail below.

Waveform detector 120b is a simple and specific design used to provide a clearer understanding of the invention. More complicated designs having more delay elements and logic can be used to detect longer and/or more complicated data patterns and are within the scope of the invention. For example, a waveform detector can be designed to detect patterns of three, four, five, or more consecutive zeros or ones. The waveform detector can also be designed to detect patterns having a particular number of zeros or ones within a particular time interval (e.g., three zeros or ones within four clock cycles). Thus, a waveform detector can be designed to detect any set of data patterns of interest.

The waveform detector can also be designed to provide any set of control signals. The control signal(s) required to be generated are typically dependent on the particular design of the pre-driver and driver, the particular characteristics to be adjusted, and so on. Thus, control signals different from those shown in FIG. 3 can be generated and are within the scope of the invention.

Figure 4:
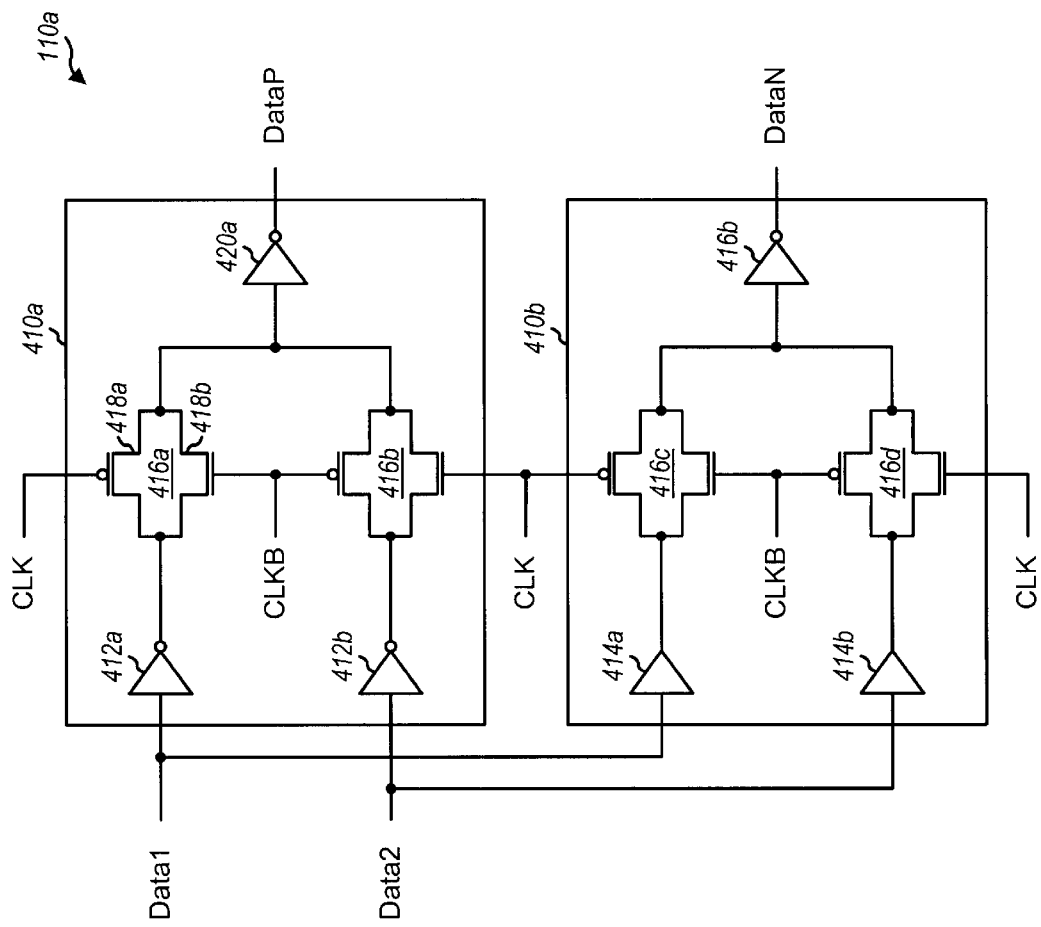
FIG. 4 is a schematic diagram of an embodiment of a multiplexer.

FIG. 4 is a schematic diagram of an embodiment of multiplexer 110a, which can be used implement multiplexer 110 in FIG. 1. Multiplexer 110a multiplexes the data received on the two data signals, Data1 and Data2, onto the differential data signal, DataP and DataN. Multiplexer 110a includes two 2:1 multiplexers 410a and 410b. Each multiplexer 410 receives the data signals, Data1 and Data2, multiplexes the data received on the input data signals, and provides the multiplexed data onto an output data signal, DataP or DataN.

Within multiplexer 410a, the data signals Data1 and Data2 are provided to inverters 412a and 412b, respectively, which buffer and invert the received signals. Each inverter 412 couples to a respective transmission gate 416 that selectively passes the received signal. The outputs of transmission gates 416a and 416b further couple to an inverter 420a, which provides buffering and signal inversion for the output data signal, DataP.

Each transmission gate 416 comprises an N-channel transistor 418a coupled in parallel with a P-channel transistor 418b. The gate of N-channel transistor 418a receives one clock signal (either CLK or CLKB, as shown in FIG. 4) and the gate of P-channel transistor 418b receives the complementary clock signal (either CLKB or CLK). Depending on the polarity of the clock signals coupled to transistors 418a and 418b, the received data signal can be coupled to the output of transmission gate 416 on either the high or low half of the clock signal. For the configuration shown in FIG. 4, transmission gates 416a and 416c provide the data on the data signal Data1 to the output of multiplexers 410a and 410b, respectively, on the high half of the clock signal, and transmission gates 416b and 416d provide the data on the data signal Data2 to the output of multiplexers 410a and 410b, respectively, on the low half of the clock signal.

The combination of inverters 412 and 420 within multiplexer 410a results in no net signal inversion for multiplexer 410a. Multiplexer 410b is similar to multiplexer 410a but includes a pair of non-inverting buffers 414a and 414b in place of the pair of inverters 412a and 412b in multiplexer 410a. Thus, multiplexer 410b provides a signal inversion for the complementary data signal, DataN.

As noted above, multiplexer 110 is used to support data transmission on both edges of the clock signal. For applications that do not require this increased data transmission, multiplexer 110 is not needed and the input data signal (e.g., Data1 or Data2) can be provided directly to pre-driver 130. Multiplexer 110 can thus be eliminated or replaced with resistors, latches, gates, or some other elements.

Pre-driver 130 can be designed to provide pre-drive signals having characteristics that can be adjusted depending on the patterns detected in the differential data signal, DataP and DataN, being provided to the pre-driver. The characteristics to be adjusted are typically dependent on the design goals to be achieved for the output driver. Various characteristics can be adjusted and are within the scope of the invention. For example, the delay through the output driver, the slew rate, the drive strength, and so on, can be adjusted based on the detected data patterns.

In one specific implementation, the slew rate of the pre-drive signal and the drive strength of the pre-driver are both increased to provide compensation if less frequent data transitions is detected. This compensation reduces the amount of skew between a waveform having frequent data transitions and a waveform having less frequent data transitions, as illustrated below.

FIG. 5A is a diagram that shows exemplary waveforms for an output signal 510a having frequent transitions versus an output signal 510b having less frequent data transitions. Typically, the slew rate of the output signal is limited by the physical characteristics of the line being driven. The parasitic capacitance and resistance in the line generally limit the slew rate and the peak-to-peak signal swing at the highest switching rate (i.e., a sequence of alternating ones and zeros) for a particular output driver design.

However, when less frequent data transitions are present (e.g., a string of all ones or all zeros), the output signal can appear to switch at a lower rate. Since more time is available for each transition, the peak-to-peak signal swing is typically greater. However, when the output signal does switch, it starts from a higher signal level and, for the same drive characteristics, takes a longer time period to transition to the mid-point. Thus, a skew exists between output signal 510a having frequent data transitions and output signal 510b having less frequent data transitions. This skew translates to intersymbol interference (ISI), which increases the likelihood of erroneous data detection at the receiving device.

FIG. 5B is a diagram that shows exemplary waveforms for output signal 510a having frequent transitions versus an output signal 510c having less frequent data transitions but compensated in accordance with the invention. To reduce the amount of skew, various drive characteristics can be adjusted. For example, the slew rate may be increased, the delay of the output signal may be adjusted (e.g., speeded up), the drive strength may be increased, or a combination thereof. Other signal characteristics can also be adjusted and are within the scope of the invention. These adjustments can be viewed as compensation for the output signal when less frequent transitions are detected. As shown in FIG. 5B, with the compensation enabled, the amount of skew can be reduced.

Figure 6:
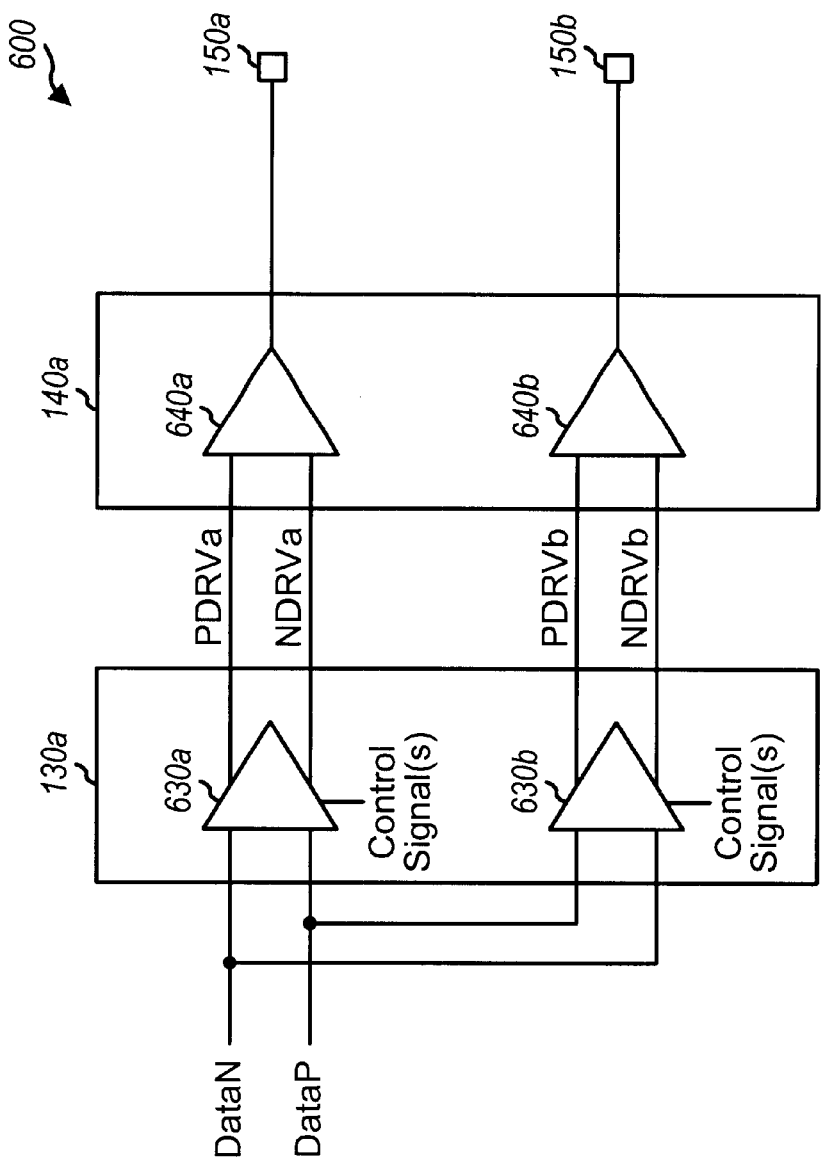
FIG. 6 is a block diagram of an embodiment of a driver unit.

FIG. 6 is a block diagram of an embodiment of a driver unit 600, which can be used to implement pre-driver 130 and driver 140 in FIG. 1. Driver unit 600 includes a pre-driver 130a coupled to a driver 140a. Pre-driver 130a includes a pair of pre-drivers 630a and 630b, with each pre-driver 630 receiving the differential data signal, DataP and DataN, and providing a respective differential pre-drive signal, PDRVx and NDRVx, where "x" denotes either "a" or "b". Driver 140a includes a pair of drivers 640a and 640b, with each driver 640 receiving a respective differential pre-drive signal, PDRVx and NDRVx, and driving a respective pad 150.

Driver unit 600 represents a specific design in which the differential output data signal, DataP and DataN, are provided to two pads 150a and 150b. Each pad 150 is driven by a respective driver 640. One (non-inverting) driver 640a provides an output signal having the same polarity as that of the received data signal, DataP, and the other (inverting) driver 640b provides an output signal having the opposite polarity as that of the received data signal. In this design, the two drivers 640a and 640b are driven by two respective pairs of pre-drive signals. The two pairs of pre-drive signals are complementary to each other (i.e., PDRVa is complementary to PDRVb, and NDRVa is complementary to NDRVb) and the two pre-drive signals within each pair have the same polarity for most of the time but have characteristics that can be adjusted near the data transitions to provide compensation for the output drive signal.

In this specific design, the characteristics of the four pre-drive signals, PDRVa, NDRVa, PDRVb, and NDRVb, are adjusted by the five control signals generated as shown in FIG. 3. The control signal PE increases the slew rate of all pre-drive signals if a sequence of two zeros or two ones is detected. The control signals NCO and PCZ are provided to pre-driver 630a used to further adjust the characteristics of the pre-drive signals, PDRVa and NDRVa, provided to the non-inverting driver 640a, with the control signal NCO used to adjust the high-to-low transition in the output signal and the control signal PCZ used to adjust the low-to-high transition. Similarly, the control signals PCO and NCZ are provided to pre-driver 630b and used to adjust the characteristics of the pre-drive signals, PDRVb and NDRVb, provided to the inverting driver 640b, with the control signal PCO used to adjust the low-to-high transition in the output signal and the control signal NCZ used to adjust the high-to-low transition.

Figure 7:
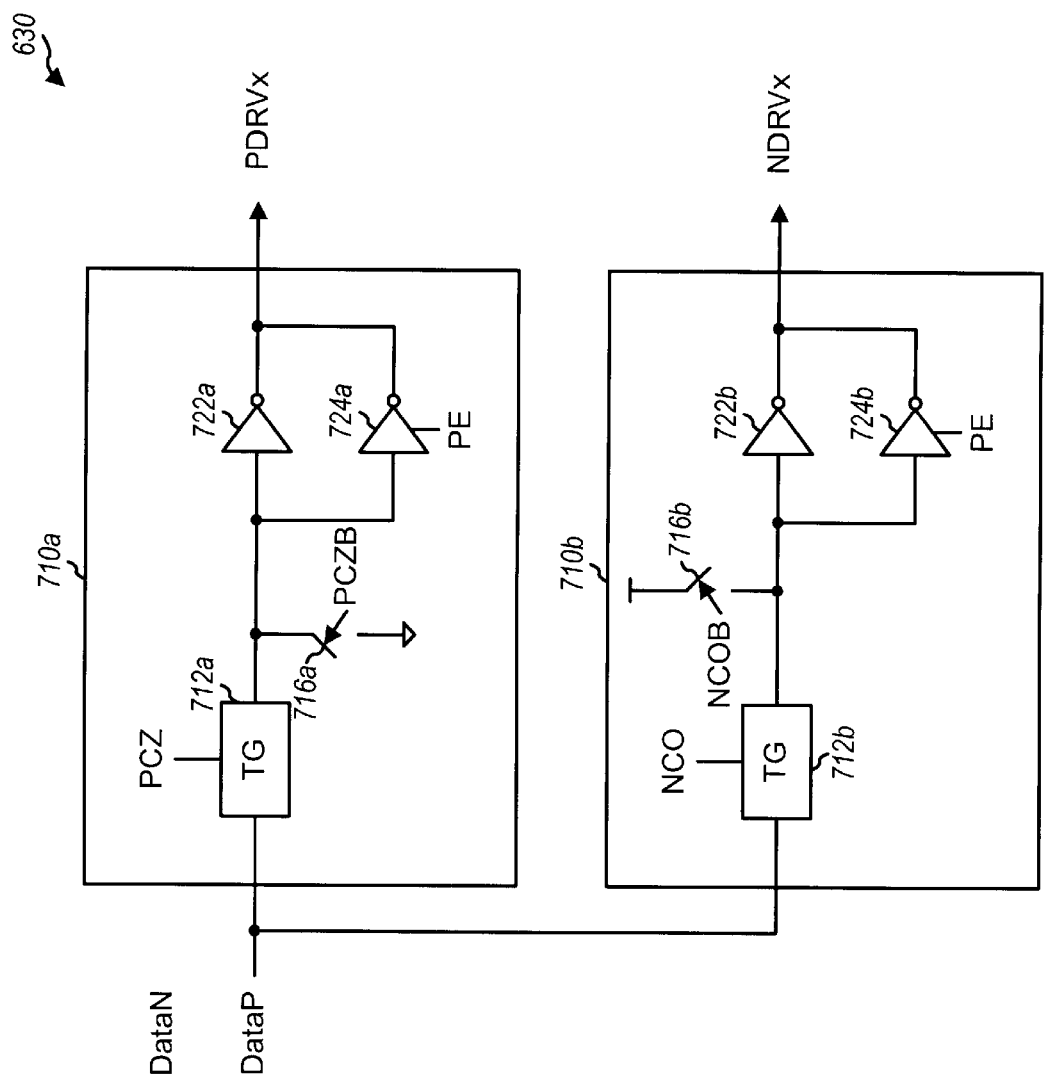
FIGS. 7 and 8 are a block diagram and a schematic diagram of a specific embodiment of a pre-driver.

FIG. 7 is a schematic diagram of a specific embodiment of a pre-driver 630, which can be used to implement each of pre-drivers 630a and 630b in FIG. 6. In this embodiment, the data signal DataP is provided to two pre-driver circuits 710a and 710b that generate the pre-drive signals PDRVx and NDRVx, respectively. These pre-drive signals are then provided to a subsequent driver 640 in FIG. 6.

Within pre-driver circuit 710a, the data signal DataP is provided to a transmission gate 712a. The output of transmission gate 712a couples to one end of a switch 716a and to the inputs of inverting buffers 722a and 724a. The other end of switch 716a couples to ground. The outputs of buffers 722a and 724a couple together and provide the pre-drive signal PDRVx.

In the specific design shown in FIG. 7, if compensation is enabled (i.e., the control signal PCZ is logic high), transmission gate 71 2a passes the data signal DataP to the inputs of inverting buffers 722a and 724a and switch 71 6a is disabled. This allows the data signal DataP to provide a low-to-high drive in the pre-drive signal, PDRVx, after a sequence of zeros has been detected. Otherwise, if compensation is disabled (i.e., the control signal PCZ is logic low), the data signal DataP is blocked by transmission gate 712a and switch 716a is shorted to ground. This causes the pre-drive signal PDRVx to remain in the high state. In this design, inverting buffer 722a is enabled at all times and inverting buffer 724a is enabled by the control signal PE (e.g., if a sequence of all zeros or all ones is detected) to provide additional drive strength for the pre-drive signal, PDRVX.

Pre-driver circuit 710b is similar to pre-driver circuit 710a. However, transmission gate 712b is controlled by the control signal NCO. Also, pre-driver circuit 710b includes a switch 716b that couples between the output of transmission gate 712b and the positive supply.

The operation of pre-driver circuit 710b is complementary to that of predriver circuit 710a. If compensation is enabled (i.e., the control signal NCO is logic high), transmission gate 712b passes the data signal DataP to the inputs of inverting buffers 722b and 724b and switch 716b is disabled. This allows the data signal DataP to provide a high-to-low drive in the pre-drive signal, NDRVx, after a sequence of ones has been detected. Otherwise, if compensation is disabled (i.e., the control signal NCO is logic low), the data signal DataP is blocked by transmission gate 712b and switch 716b is pulled to the positive supply. This causes the pre-drive signal, NDRVx, to remain in the low state. In this design, inverting buffer 722b is enabled at all times and inverting buffer 724b is enabled by the control signal PE (e.g., if a sequence of all zeros or all ones is detected) to provide additional drive strength for the pre-drive signal, NDRVx.

As shown in FIG. 7, the pre-drive signals PDRVx and NDRVx have characteristics that can be varied depending on the patterns detected in the data signal DataP. In normal operation, one inverting buffer 722 in each pre-driver circuit 710 is active and used to drive the pre-drive signal. In this specific design, if a string of two consecutive zeros or ones is detected, as signified by the control signal PE being at logic high, the second inverting buffer 724 is enabled in each pre-driver circuit 710. The second inverting pre-driver is used to provide additional drive capability for the pre-drive signal. Also, in this design, pre-driver circuit 710a can be further compensated to provide faster slew rate, additional drive strength, reduced delay, or a combination thereof, if two consecutive zeros are detected, and pre-driver circuit 710b can be further compensated if two consecutive ones are detected.

Figure 8:
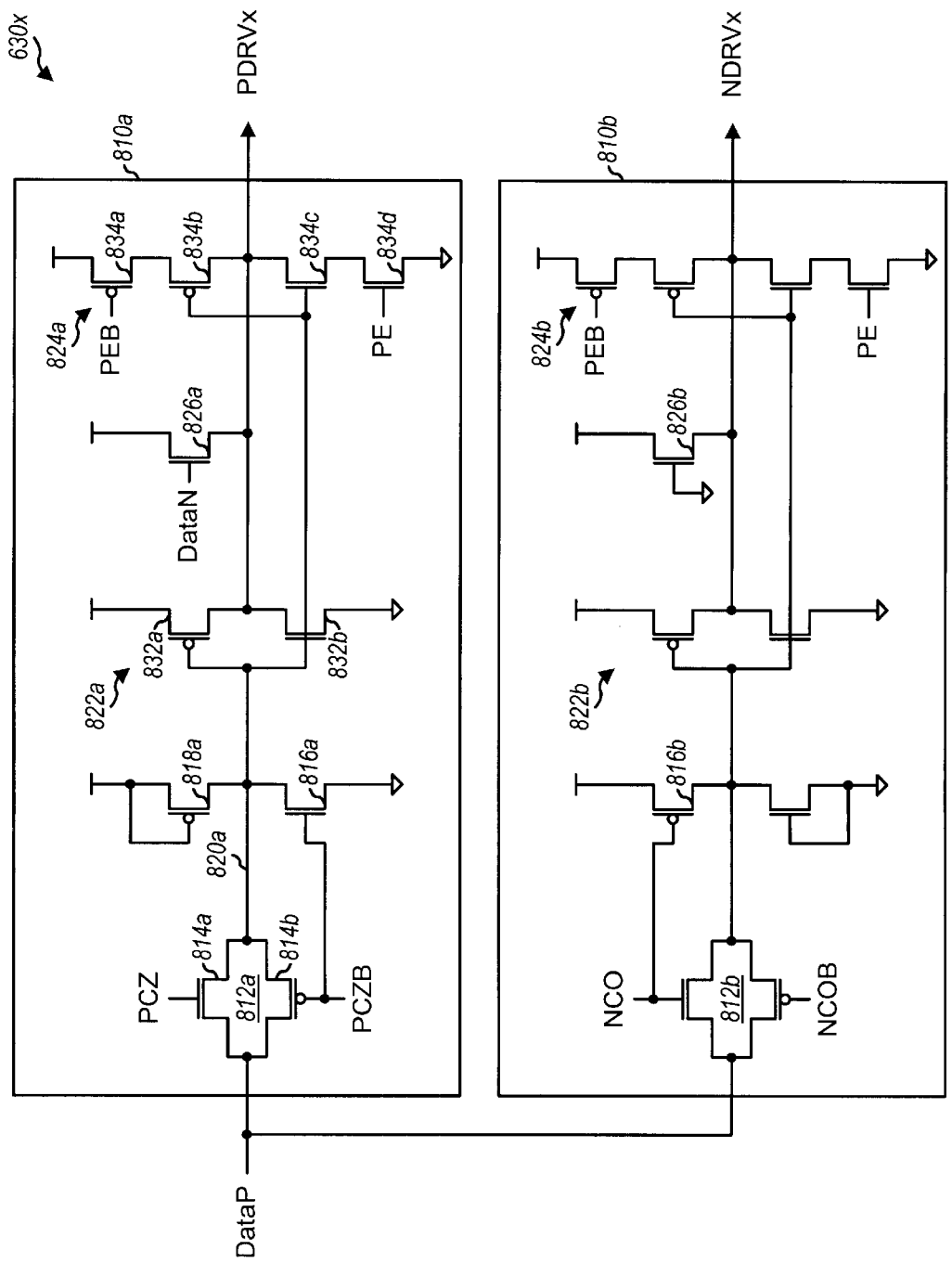

FIG. 8 is a schematic diagram of a specific embodiment of a pre-driver 630x, which is one implementation of pre-driver 630 in FIG. 7 and which can also be used to implement each of pre-drivers 630a and 630b in FIG. 6. In this embodiment, the differential data signal, DataP and DataN, is provided to two pre-driver circuits 810a and 810b that generate the pre-drive signals PDRVx and NDRVx, respectively.

Within pre-driver circuit 810a, the data signal DataP is provided to a transmission gate 812a comprised of an N-channel transistor 814a coupled in parallel with a P-channel transistor 814b. The output of transmission gate 812a couples to the drain of an N-channel transistor 816a and to the source of a P-channel transistor 818a. The source of N-channel transistor 816a couples to ground and the gate receives the control signal PCZB. The drain and gate of P-channel transistor 818a couples to the positive supply. N-channel transistor 816a implements a switch that is turned on (and pulls node 820a to ground) when the control signal PCZB is high (i.e., the control signal PCZ is low). P-channel transistor 818a provides load balancing and skew reduction.

The output of transmission gate 812a further couples to the inputs of inverting buffers 822a and 824a (which are also referred to herein as output circuits). Inverting buffer 822a is made up of a P-channel transistor 832a coupled in series with an N-channel transistor 832b. The gates of transistors 832a and 832b couple together and form an input that couples to the output of transmission gate 812a. The source of P-channel transistor 832a and the drain of N-channel transistor 832b couple together and form an output that drives the pre-drive signal PDRVx.

Inverting buffer 824a is made up of a series combination of P-channel transistors 832a and 832b and N-channel transistors 832c and 832d. The gates of transistors 834b and 834c couple together and form an input that couples to the output of transmission gate 812a. The source of P-channel transistor 834b and the drain of N-channel transistor 834c couple together and form an output that, when enabled, further drives the pre-drive signal PDRVx. The gate of P-channel transistor 834a receives the complementary control signal PEB and the gate of N-channel transistor 834d receives the control signal PE. Transistors 834a and 834d enable inverting buffer 824a when the control signal PE is logic high. For the PE signal generated as shown in FIG. 3, inverting buffer 824b is enabled when a sequence of (two) consecutive zeros or ones is detected, to increase the drive strength. Otherwise, inverting buffer 824b is disabled.

In the specific design shown in FIG. 8, an N-channel transistor 826a has a drain that couples to the positive supply and a source that couples to the output of pre-driver circuit 810a. The gate of N-channel transistor 826a receives the complementary data signal DataN. During a low-to-high transition in the data signal DataN, N-channel transistor 826a is enabled and provides additional low-to-high drive for the pre-drive signal PDRVx.

Pre-driver circuit 810b includes a transmission gate 812b that couples in series with inverting buffers 822b and 824b. Inverting buffers 822a and 824b couple in parallel and provide the drive for the complementary pre-drive signal, NDRVx. These elements of pre-driver circuit 810b are similar to those of pre-driver circuit 810a and also operate in similar manner. For example, inverting buffer 824b is enabled when the control signal PE is logic high and disabled otherwise.

Pre-driver circuit 810b also includes some differences to account for the fact that pre-driver circuit 810b is providing a complementary pre-drive signal, NDRVx. For example, P-channel transistor 816a is a switch that pulls the output of transmission gate 812b high when enabled. Also, pre-driver circuit 810b includes an N-channel transistor 826b that provides a balanced load (to balance N-channel transistor 826a in pre-driver circuit 810a) and reduced skew. The drain of N-channel transistor 826b couples to the positive supply, the source couples to the output of pre-driver circuit 810b, and the gate couples to ground, thereby maintaining P-channel transistor 826b in a perpetual off state.

Pre-driver 630x in FIG. 8 generates differential pre-drive signal, PDRVx and NDRVx, which is then provided to a subsequent driver. As shown in FIG. 8, the predrive signal PDRVx has some characteristics that are adjusted in similar manner as for the pre-drive signal NDRVx. For example, if the slew rate of the pre-drive signal PDRVx is increased, the slew rate of the pre-drive signal NDRVx is also increased. Also, if waveforms having two consecutive zeros are blocked from the pre-drive signal PDRVx, then waveforms having two consecutive ones are blocked from the pre-drive signal NDRVx.

However, certain characteristics of the pre-drive signal PDRVx may be adjusted in a complementary manner to those of the pre-drive signal NDRVx. For example, an additional pull-up transistor (e.g., transistor 826a in FIG. 8) may be provided for the pre-drive signal PDRVx to reduced the skew caused by different loads on the PDRVx and NDRVx signals.

Pre-driver 630x in FIG. 8 generates the differential pre-drive signal, PDRVx and NDRVx, which is then provided to driver 640a or 640b in FIG. 6. Another pre-driver 630x is provided to received the control signals (e.g., PE, PCO, and NCZ) and generate the pre-drive signal for the other driver 640b or 640a.

The characteristics of the pre-drive signals, PDRVx and NDRVx, can be adjusted based on the detected patterns in the received differential data signal, DataP and DataN. For example, the drive strength of the pre-drive signals PDRVx and NDRVx can be adjusted by enabling and disabling additional inverting buffers 824a and 824b prior to the arrival of the transition being operated on.

The drive strength of pre-driver 630x can also be adjusted by "speeding up" the response of pre-driver circuit 810a or 810b for the complementary transition. Speeding up pre-driver 630x may be preferable for some applications than switching additional buffers on and off because the output impedance of the pre-driver, which may be matched to the line impedance, is not changed, and this may result in lesser amount of reflections in the line. To speed up the response, each of the pre-drive signals, PDRVx or NDRVx, may be selectively sped up based on the detected pattern. For example, if a string of zeros (or ones) is detected, pre-driver circuit 810a (or 810b) can be speed up by passing the data signal DataP through transmission gate 812a (or 812b). This then strengthens the upcoming low-to-high (or high-to-low)

transition in the pre-drive signal without changing the DC bias condition. Once the low-to-high (or high-to-low) transition has taken place, additional inverting buffers 824a and 824b can be disabled and pre-driver circuit 810a (or 810b) can be operated at the normal manner, until another pattern of interest is detected.

Although not described above for simplicity, the amount of adjustment or compensation can be dependent on the detected patterns. For example, more compensation may be provided for longer sequences of zeros or ones and less compensation may be provided for shorter sequences of zeros or ones. Also, the amount of compensation may be dependent on the operating conditions experienced by the output driver. For example, more compensation may be provided if the fabrication process is slower than normal, if the power supply is lower, if the temperature is higher, and so on.

Figure 9:
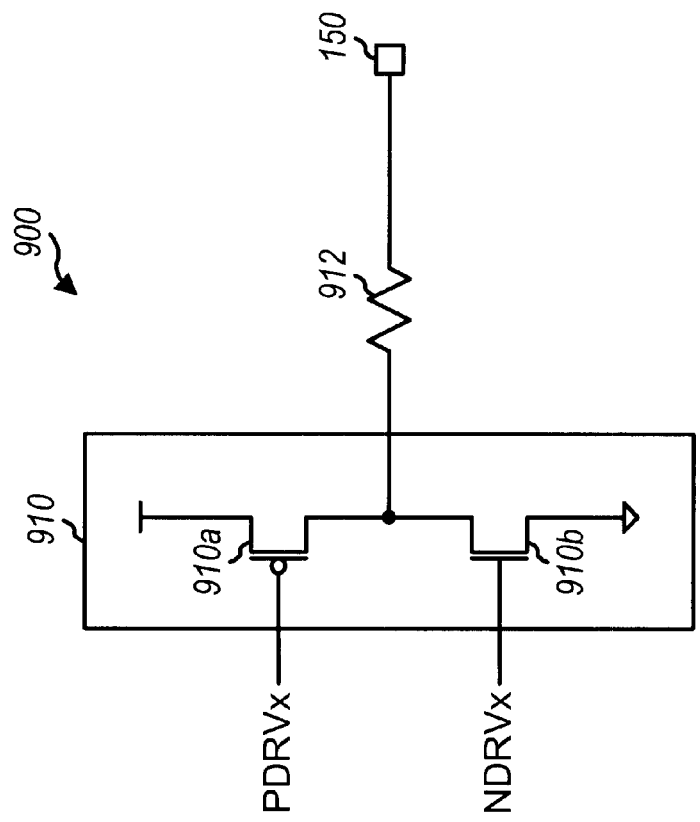
FIG. 9 is a schematic diagram of a specific embodiment of a driver circuit.

FIG. 9 is a schematic diagram of a specific embodiment of a driver circuit 900, which can be used to implement each of drivers 640a and 640b in FIG. 6. In this embodiment, driver circuit 900 includes a P-channel transistor 910a coupled in series with an N-channel transistor 910b. The pre-drive signals PDRVx and NDRVx are provided to the gates of P-channel transistor 910a and N-channel transistor 910b, respectively. The source of P-channel transistor 910a couples to the drain of N-channel transistor 910b and to one end of a resistor 912. The other end of resistor 912 couples to the output pad 150.

In the specific design shown in FIG. 9, driver circuit 900 is a "fixed" design that provides an output drive signal having characteristics that can be adjusted based on the received pre-drive signals PDRVx and NDRVx. In other designs, the driver circuit can be designed to provide an output drive signal having characteristics that can also be adjusted based on one or more control signals. For example, driver circuit 900 can be designed with: (1) one or more additional P-channel transistors coupled in parallel with P-channel transistor 910a and enabled by one or more respective control signals, (2) one or more additional N-channel transistor coupled in parallel with N-channel transistor 910b and enabled by the same or different one or more respective control signals, or (3) a combination of additional P-channel and N-channel transistors. Each additional P- or N-channel transistor, when enabled, can provide additional signal drive for the pad, thereby altering the output drive characteristics.

The additional transistor(s) may be enabled dynamically during operation of the output driver based on detected operation conditions, or may be selectively turned on during the manufacturing process and remained fixed. Also, the number of additional transistors to be enabled may be dependent on, for example, the fabrication process (e.g., fast or slow), the operating condition (e.g., low or high voltage, hot or cold temperature), the output drive requirements, and other factors.

Referring back to FIG. 6, in a specific design, driver unit 600 is replicated a number of times (e.g., 2, 3, 4, 5, or more) and coupled in parallel to allow for further adjustment of the output drive characteristics. A set of enable signals can be provided to individually enable each driver unit 600. In this design, each pad 150 may be driven by one or more drivers 640, depending on which ones have been enabled. For example, N pairs of pre-drivers 630a and 630b can be provided to provide N pairs of differential pre-drive signals, PDRVa and NDRVa and PDRVb and NDRVb, that are then used to respectively drive N pairs of drivers 640a and 640b.

Each driver unit 600 (i.e., each pair of pre-driver circuit 630a and 630b and the corresponding pair of drivers 640a and 640b) can be enabled by a respective enable signal. This allows for each pad to be driven by 1, 2, . . . , or N drivers 640. The number of drivers 640 to be enabled may be dependent on any set of factors described above.

In the specific design shown in FIGS. 7 and 8, each pre-driver 630 is controlled with the received control signals (e.g., PE, NCO, PCO, NCZ, and PCZ) to adjust the characteristics of the pre-drive signals, PDRVx and NDRVx, provided to the subsequent driver 640, which in turn determines the characteristics of the output drive signals to the pad. In this design, the control signal PE is used in all pre-drivers 630 and the control signals NCO, PCO, NCZ, and PCZ are applied to specific pre-drivers. As noted above, each driver 640 can also be designed such that it can be controlled with the same or different control signals to more directly adjust the characteristics of the output drive signals. Other designs for pre-driver 630 and driver 640 to adjust the characteristics of the output drive signals can thus be contemplated and are within the scope of the invention.

The output driver of the invention can be used for various applications including computing, networking, and other applications. The output driver described herein can provide improved performance, especially for high data rate applications, low voltage output driver designs (e.g., low voltage differential signal (LVDS)), and others. The implementation of the output driver using P-channel and N-channel transistors (e.g., as shown in FIGS. 8 and 9), or other types of transistors (e.g., bipolar, GaAs, and so on), allows the output driver to be used in many types of integrated circuit. The output driver of the invention can be employed in an ASIC, a digital signal processor, a microprocessor, a controller, a memory device, and so on.

The foregoing description of the specific embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein, and as defined by the following claims.

What is claimed is:

1. An output driver comprising:
   a waveform detector operative to receive at least one data signal, detect for particular patterns of interest within the at least one data signal, and provide one or more control signals indicative of detection of the particular patterns of interest in the at least one data signal; and
   a driver unit coupled to the waveform detector and operative to receive the at least one data signal and provide at least one output signal in response thereto, wherein the driver unit is further operative to receive the one or more control signals and adjust one or more characteristics of the at least one output signal in accordance with the one or more received control signals.

2. The output driver of claim 1, wherein the particular patterns to be detected include sequences of a particular number of consecutive zeros or ones.

3. The output driver of claim 1, wherein the particular patterns to be detected include sequences of two or more consecutive zeros or ones.

4. The output driver of claim 1, wherein slew rate of the at least one output signal is adjusted based on detection of the particular patterns in the at least one data signal.

5. The output driver of claim 4, wherein the slew rate of the at least one output signal is adjusted upon detection of a particular number consecutive zeros or ones in the at least one data signal.

6. The output driver of claim 1, wherein delay of the at least one output signal is adjusted based on the detected patterns.

7. The output driver of claim 1, wherein drive strength of the at least one output signal is adjusted based on the detected patterns.

8. The output driver of claim 1, wherein the one or more characteristics of the at least one output signal are adjusted to reduce skew.

9. The output driver of claim 1, wherein the driver unit includes
a pre-driver coupled to the waveform detector and operative to receive the at least one data signal and provide at least one pre-drive signal in response thereto, wherein the pre-driver further is operative to receive the one or more control signals and adjust one or more characteristics of the at least one pre-drive signal in accordance with the one or more received control signals, and
a driver coupled to the pre-driver and operative to receive the at least one pre-drive signal and provide the at least one output signal in response thereto.

10. The output driver of claim 9, wherein the pre-driver includes
at least one pre-driver circuit, one pre-driver circuit for each of the at least one output signal, wherein each pre-driver circuit includes a plurality of output circuits, and wherein at least one output circuit within each pre-driver circuit can be selectively disabled and enabled, based on a received control signal, to adjust drive characteristics of the pre-drive signal being provided by the pre-driver circuit.

11. The output driver of claim 10, wherein each pre-driver circuit further includes
a transmission gate operative to receive a control signal and either pass or block the data signal provided to the pre-driver circuit based on the received control signal.

12. The output driver of claim 10, wherein each pre-driver circuit further includes
a switch operative to receive a control signal and selectively pull an input of the pre-driver circuit to either logic high or logic low in accordance with the received control signal.

13. The output driver of claim 1, further comprising:
a multiplexer operative to receive and multiplex data received on a plurality of input signals onto the at least one data signal.

14. The output driver of claim 13, wherein the multiplexer is operative to provide data on both edges of a clock signal.

15. The output driver of claim 1, wherein the waveform detector includes
at least one set of delay elements, one set for each of the at least one data signal, each set of delay elements providing delays for the respective data signal,
a pattern detector coupled to the at least one set of delay elements and operative to receive delayed data signals and generate a set of intermediate signals indicative of the detection of the particular patterns, and
a control signal generator coupled to the pattern detector and operative to receive the set of intermediate signals and generate the one or more control signals.

16. An output driver comprising:
a waveform detector operative to receive at least one data signal, detect for particular patterns of interest within the at least one data signal, and provide one or more control signals indicative of detection of the particular patterns of interest in the at least one data signal, wherein the waveform detector includes
at least one set of delay elements, one set for each of the at least one data signal, each set of delay elements providing delays for the respective data signal,
a pattern detector coupled to the at least one set of delay elements and operative to receive delayed data signals and generate a set of intermediate signals indicative of the detection of the particular patterns, and
a control signal generator coupled to the pattern detector and operative to receive the set of intermediate signals and generate the one or more control signals; and
a driver unit coupled to the waveform detector and operative to receive the at least one data signal and provide at least one output signal in response thereto, wherein the driver unit includes
a pre-driver coupled to the waveform detector and operative to receive the at least one data signal and provide at least one pre-drive signal in response thereto, wherein the pre-driver further is operative to receive the one or more control signals and adjust one or more characteristics of the at least one pre-drive signal in accordance with the one or more received control signals, and
a driver coupled to the pre-driver and operative to receive the at least one pre-drive signal and provide the at least one output signal in response thereto.

17. A method for adjusting characteristics of an output signal, the method comprising:
receiving at least one data signal;
detecting for particular patterns of interest within the at least one received data signal;
provide one or more control signals indicative of detection of the particular patterns of interest in the at least one received data signal;
providing at least one output signal in response to the at least one received data signal; and
adjusting one or more characteristics of the at least one output signal in accordance with the one or more received control signals.

18. The method of claim 17, wherein slew rate of the at least one output signal is adjusted based on detection of the particular patterns in the at least one data signal.

19. The method of claim 17, wherein delay of the at least one output signal is adjusted based on detection of the particular patterns in the at least one data signal.

20. The method of claim 17, wherein drive strength of the at least one output signal is adjusted based on detection of the particular patterns in the at least one data signal.

21. The method of claim 17, wherein the one or more characteristics of the at least one output signal are adjusted to reduce skew.

22. The method of claim 17, wherein the particular patterns of interest include sequences of a particular number of consecutive number of zeros or ones.

* * * * *